United States Patent [19]
Hulick et al.

[11] Patent Number: 5,831,822
[45] Date of Patent: Nov. 3, 1998

[54] PERSONAL COMPUTER HAVING QUICK-RELEASE COOLING FAN

[75] Inventors: Troy K. Hulick, Saratoga; Wayman Lee, Santa Clara; Jimmy A. Melton, San Jose, all of Calif.

[73] Assignee: Apple Computer, Inc., Cupertino, Calif.

[21] Appl. No.: 779,667

[22] Filed: Jan. 7, 1997

[51] Int. Cl.[6] .................................................. H05K 7/20
[52] U.S. Cl. ..................... 361/687; 361/818; 439/269.1; 439/476.1; 454/184
[58] Field of Search ....................... 364/708.1; 236/1 G; 165/80.3, 101, 137, 121–126; 454/184, 353; 415/213.1; 312/223.1, 223.2; 439/248, 266, 269.1, 296, 299, 304, 338, 374, 376, 377, 476.1, 928.1; 361/687, 796, 690–695, 816, 818, 610

[56] References Cited

U.S. PATENT DOCUMENTS

| | | | |
|---|---|---|---|
| 728,195 | 5/1903 | Brady | 361/610 |
| 4,498,119 | 2/1985 | Cronin | 361/386 |
| 4,853,830 | 8/1989 | Corfits | 361/391 |
| 4,918,572 | 4/1990 | Tarver | 361/695 |
| 4,967,311 | 10/1990 | Ferchau | 361/695 |
| 5,398,161 | 3/1995 | Roy | 361/727 |
| 5,562,410 | 10/1996 | Sachs | 415/213.1 |

*Primary Examiner*—Gerald P. Tolin
*Attorney, Agent, or Firm*—Burns, Doane, Swecker & Mathis, L.L.P.

[57] ABSTRACT

A tower computer includes a housing and an access panel which can be opened to provide access to the interior components of the housing. A cooling fan is mounted on the panel and is electrically coupled to an electrical plug which is also mounted on the panel. That plug is adapted to become automatically connected to a receptacle mounted in the housing, in response to a closing of the panel. The plug automatically becomes disconnected from the receptacle in response to the panel being opened.

5 Claims, 4 Drawing Sheets

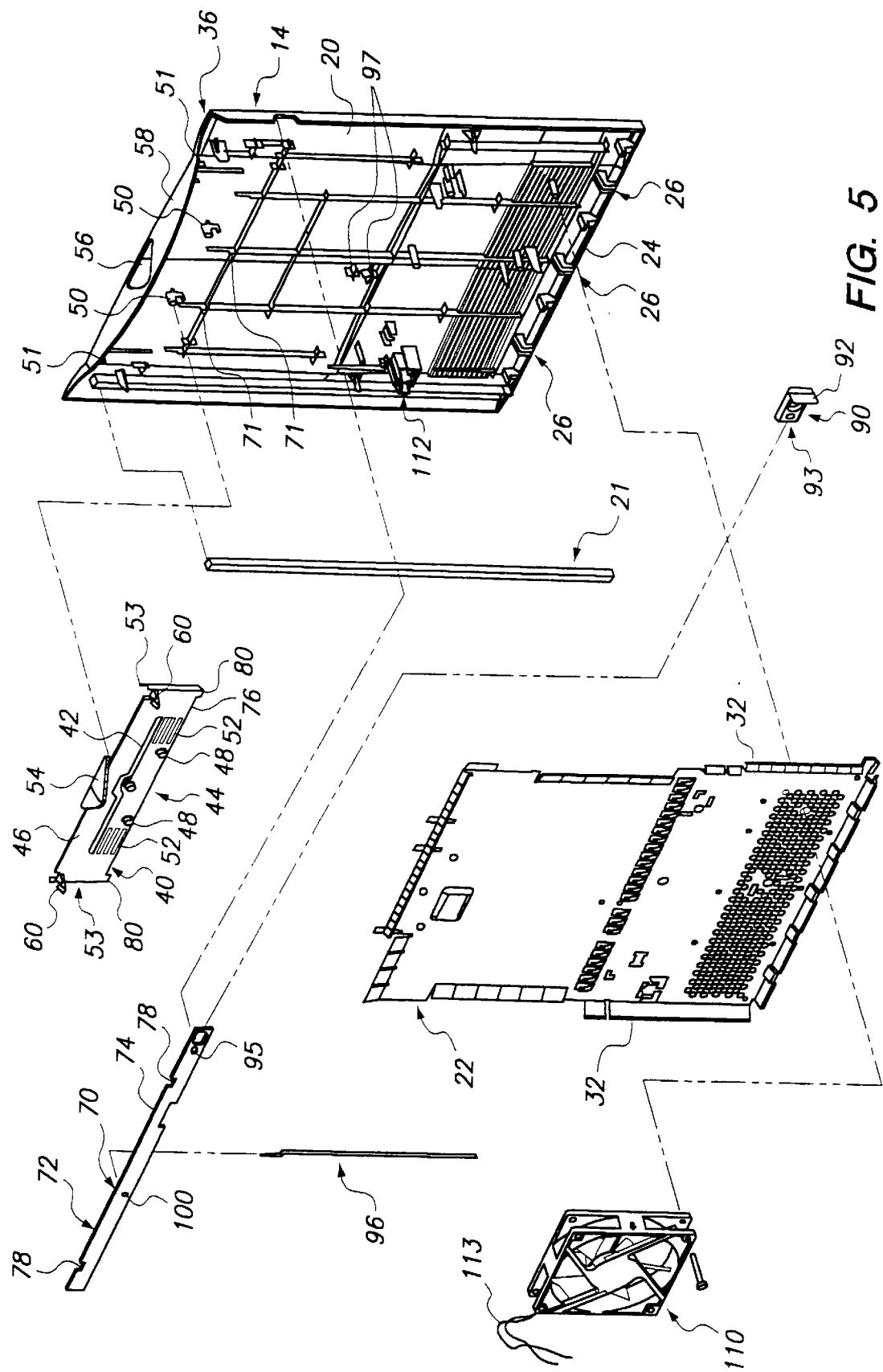

PERSONAL COMPUTER HAVING QUICK-RELEASE COOLING FAN

BACKGROUND OF THE INVENTION

The present invention relates to a personal computer and, in particular to the mounting of a cooling fan.

It is desirable that personal computers and towers be designed with a view toward facilitating access to the internal components thereof to make it easier to repair or reconfigure the computer. A personal computer typically includes a cooling fan mounted inside of the housing for the purpose of circulating cooling air. In order to access other internal components, it may be necessary to remove the fan, and then later to reinstall the fan. That practice is inconvenient and time-consuming.

It would, therefore, be desirable to mount a cooling fan in such fashion that it presents minimal obstruction to the accessing of other internal components, and requires little, if any, insertion and removal efforts.

SUMMARY OF THE INVENTION

That goal is achieved by the present invention which relates to a computer that comprises a housing containing at least a power component, an accessory card supporting component, and a first electrical coupling electrically connected to the power component. An access panel is mounted to the housing and is openable to provide access to the components. A fan for circulating cooling air within the housing is mounted on the panel. A second electrical coupling is mounted on the panel and is electrically connected to the fan. The second coupling is positioned to become electrically connected to the first coupling in response to the first panel being closed, and to become electrically disconnected from the first coupling in response to the panel being opened.

The panel and housing preferably carry mutually engageable alignment elements for aligning the first and second couplings as the panel is being closed. Some of those alignment elements are preferably formed on a metal EMI shield which is carried by the panel.

BRIEF DESCRIPTION OF THE DRAWING

The objects and advantages of the invention will become apparent from the following detailed description of a preferred embodiment thereof in connection with the accompanying drawing in which like numerals designate like elements and in which:

FIG. 5 is an exploded top perspective view of an internal side of the access panel depicted in FIG. 1;

DETAILED DESCRIPTION OF PREFERRED EMBODIMENTS OF THE INVENTION

Figure 1:
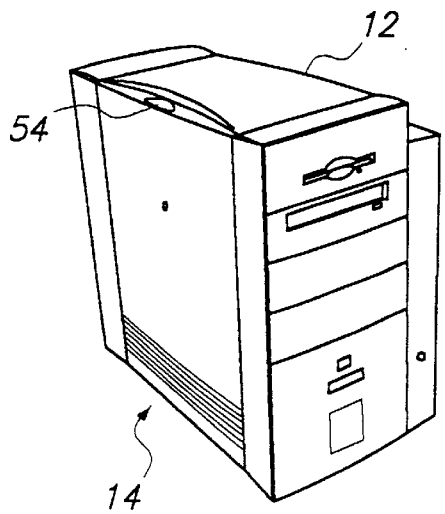
FIG. 1 is a top front perspective view of a computer tower according to the present invention.
Figure 2:
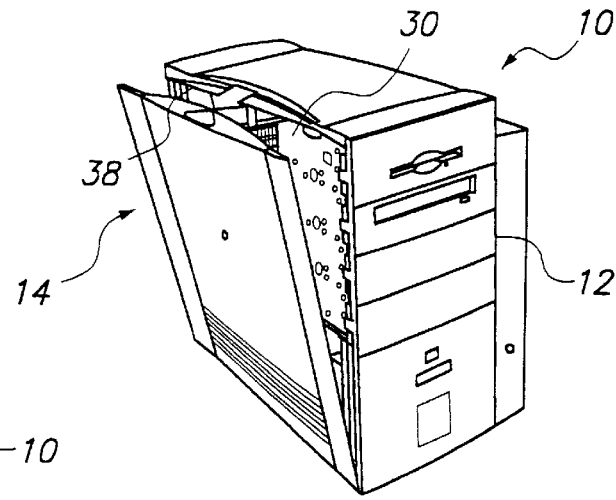
FIG. 2 is a view similar to FIG. 1 as a access panel of the tower computer is beginning to be swung open.
Figure 4:
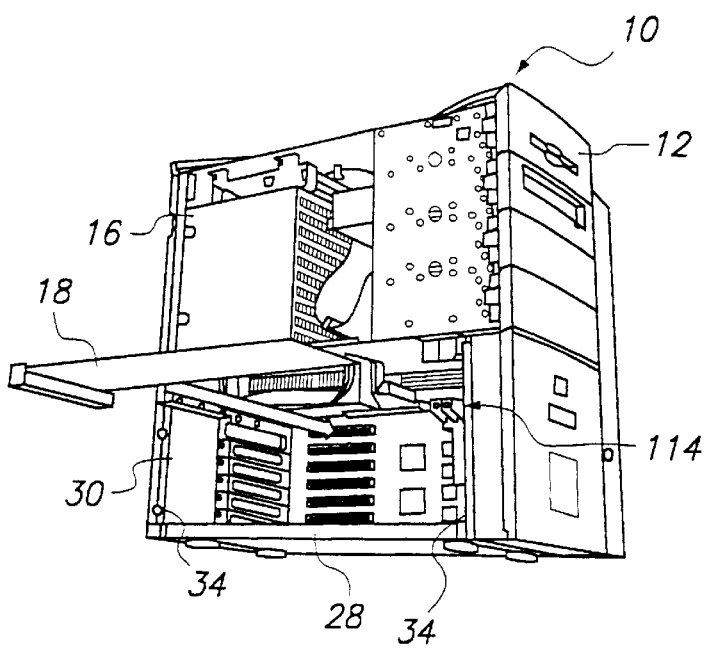
FIG. 4 is a bottom-front perspective view of the tower computer after the access panel has been removed and as an accessory card is being inserted into the interior of the computer housing.
Figure 3:
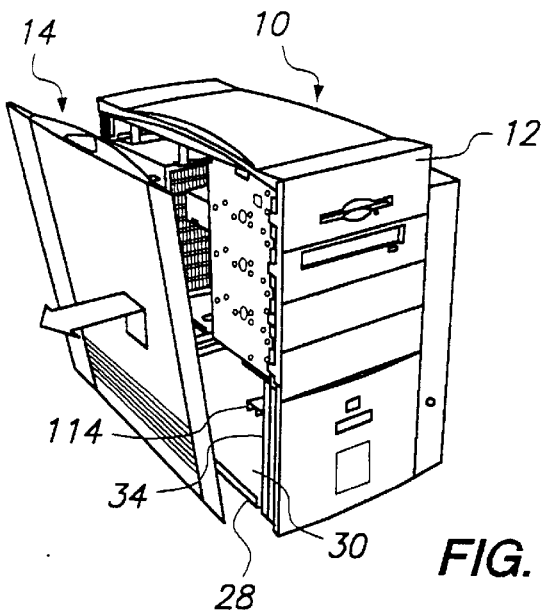
FIG. 3 is a view similar to FIG. 2 after the access panel has been opened and removed from a housing of the tower computer.

Depicted in FIG. 1 is a tower computer 10 which includes a housing 12 and an access panel 14 shown in a closed state. The tower computer 10 contains conventional components, such as a power supply 16 and accessory cards 18, e.g., PCI cards used in graphics communications, which are readily accessible by opening and removing the access panel 14, as shown in FIGS. 2–4. Some of the components could be mounted on pivoted modules so as to be swingable to an out-of-the-way position for exposing other components located therebehind.

Figure 6:
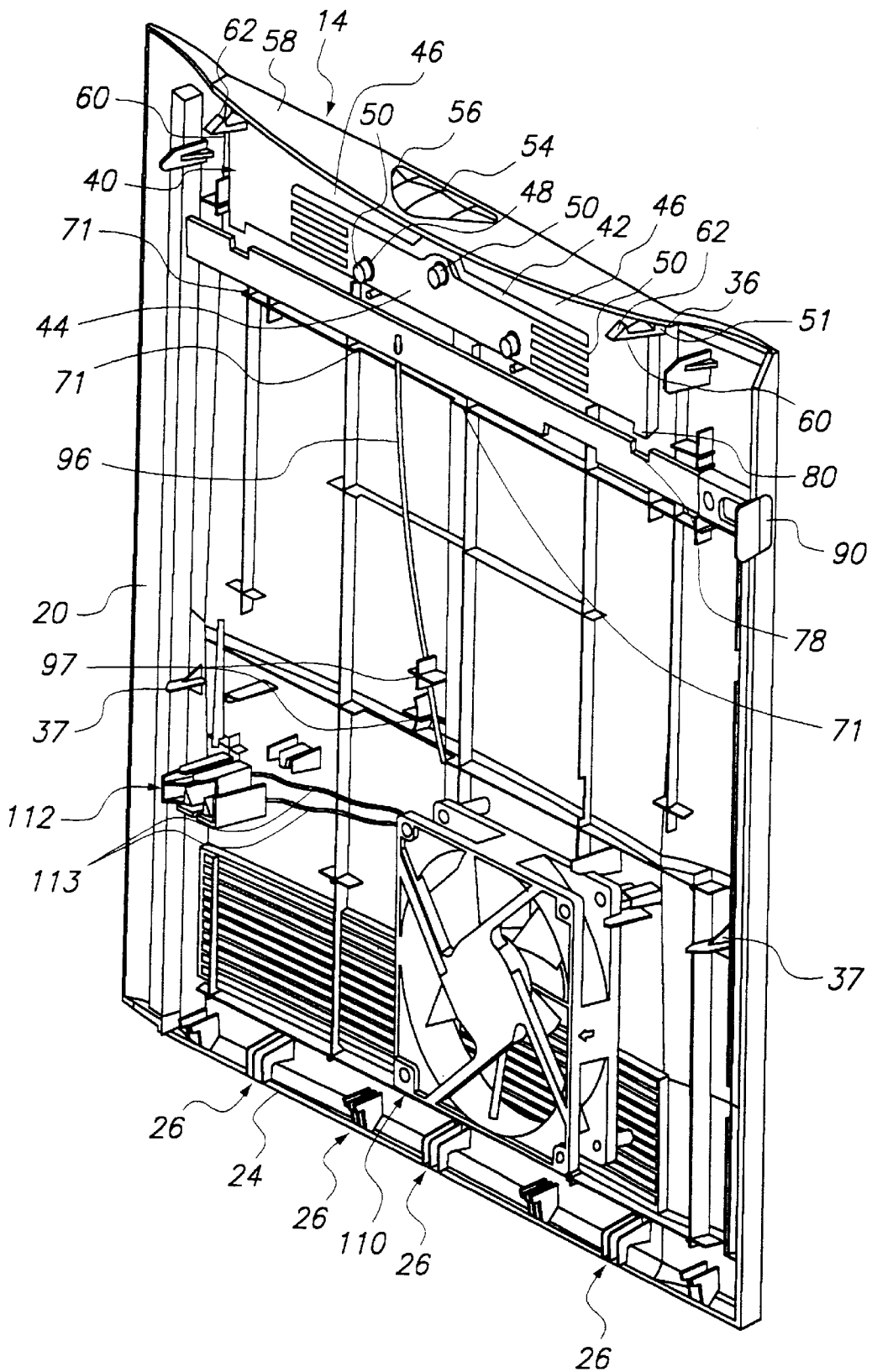
FIG. 6 is a top inner perspective view of the access panel in its assembled condition, with the locking mechanism in an unlocking state, the latch in a relaxed state, and the EMI shield removed.

The access panel 14 comprises a base 20 formed for example of plastic, and a metal EMI shielding plate 22 disposed on an inner side of the base 20 (see FIGS. 5 and 6). Alternatively, the base 20 could be formed of a conductive material, whereby no EMI shielding plate would be needed.

Along its lower edge 24, the base 20 includes a plurality of hooks 26 adapted, as the access panel 14 is being closed, to reach behind a vertical lip 28 extending along a lower edge of an opening 30 of the base 20 which is opened or closed by the access panel 14 (see FIG. 4).

The shielding plate 22 includes a series of bent-out tabs 32 arranged in vertical rows on opposite sides of the plate. Those rows of tabs 32 are adapted to engage respective vertical edges 34 of the opening 30 as the access panel 14 is being closed so as to align the access panel with the opening in a horizontal direction. The base 20 can be provided with a stiffening insert bar 21 to stiffen the base.

To close the access panel, the lower edge 24 of the access panel is placed adjacent the lip 28 of the housing, and the access panel 14 is then swung so that an upper edge 36 of the access panel approaches an upper edge 38 of the opening 30, the access panel swinging about a horizontal axis defined by the lower edge 24 of the access panel. In so doing, the tabs 32 engage respective edges 34 of the opening to horizontally shift, if necessary, the access panel to a position aligned with the opening 30. The base 20 is also provided with fingers 37 having beveled free ends to aid in performing this alignment function. Eventually, the free ends of the hooks 26 reach behind the lip 28 to secure the lower edge 24 against movement away from the housing 12. The upper edge 36 of the base then becomes secured to the upper edge 38 of the opening by a latch 40, as will now be described.

The latch 40 is a one-piece plate element formed of a resilient material such as plastic. The latch 40 includes a recess 42 which extends completely through the plate element and spaces a mounting portion 44 of the latch 40 from an actuating portion 46 thereof. The mounting portion 44 includes a plurality of holes 48 sized to receive respective posts 50 of the base to immovably mount the mounting portion 44 to the base. A pair of guide protrusions 51 formed on the base 20 engage respective vertical edges 53 of the latch 40 for guiding vertical movement of the latter.

The actuating portion 46 is capable of flexing relative to the mounting portion 44 within the plane of the plate element, such flexing made possible by the presence of the recess 42 and additional slots 52 disposed on respective sides of the mounting portion 44. A top center section of the actuating portion 46 includes a button 54 aligned with a hole 56 formed in a top horizontal flange 58 of the base 20. At top side portions of the actuating portion 46, hooks 60 are provided which are adapted to reach behind the upper edge 38 of the opening 30 to hold the access panel in a closed state. The hooks 60 are elastically flexible and include top cam faces 62 so as to engage behind the edge 38 with a snap action as the access panel is being closed. Since the lower edge of the access panel is fixed by the engagement of the hooks 26 behind the lip 28, the engagement of the hooks 60 behind the edge 38 secures the access panel to the housing.

By pressing downwardly against the button 54, the actuating portion 46 is depressed (i.e. elastically flexed) relative to the mounting portion 44 (see FIG. 7), whereupon the hooks 60 become disengaged from behind the upper edge 38 to release the access panel. However, such downward flexing of the actuating portion is controlled by a locking mechanism 70.

Figure 7:
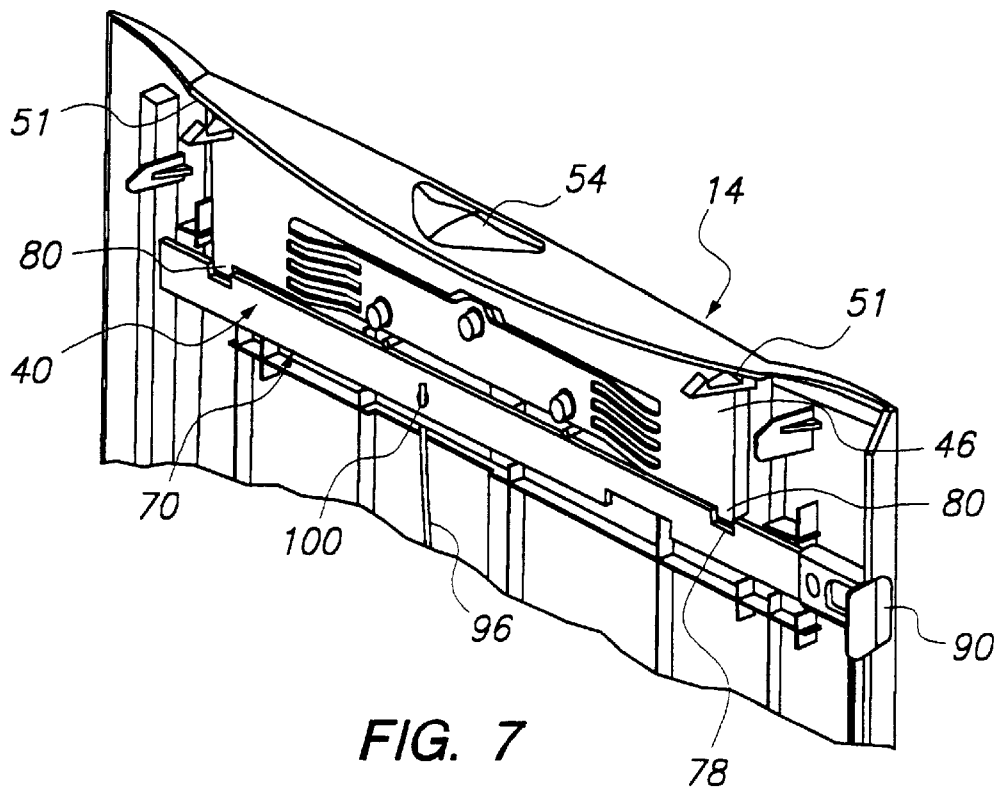
FIG. 7 is a fragmentary view similar to FIG. 6, depicting the latch in a downward or unlatching position.
Figure 8:
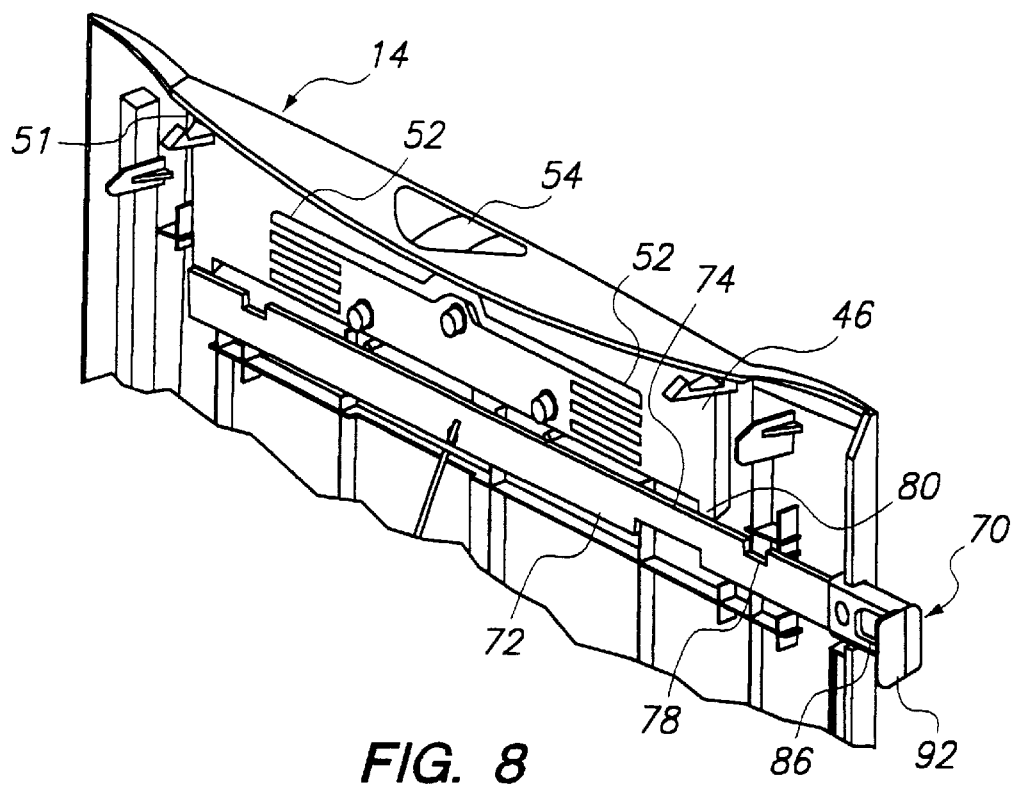
FIG. 8 is a view similar to FIG. 7 depicting the locking mechanism in a locking state.

That locking mechanism 70 includes a locking bar 72 that is slidably disposed on guide elements 71 formed on the base 20 and is reciprocable horizontally within the plane of the base 20 in a direction perpendicular to the up-down direction of movement of the actuating portion 46. The locking bar 72 includes an upper edge 74 which underlies a lower edge 76 of the latch 40 and includes a pair of notches 78. Those notches 78 are arranged to be positioned in or out of vertical alignment with a pair of projections 80 projecting downwardly from a section of the lower edge 76 formed on the actuating portion 46, depending upon the orientation of the locking bar 72. That is, when the locking bar is retracted inwardly to a release position (see FIG. 6), the notches 78 are aligned with the projections 80, permitting the actuating portion 46 to be flexed downwardly, as depicted in FIG. 7. However, when the locking bar 72 has been pulled out to a locking position (see FIG. 8), the notches 78 are out of alignment with the projections 80, whereby the upper edge 74 of the locking bar 72 prevents the actuating portion 46 from being flexed downwardly.

When the locking bar 72 is in its locking position (FIG. 8), an aperture 86 formed in an outer end thereof becomes exposed and can receive an auxiliary locking member, such as a padlock 87 (FIG. 5) or an anchored cable, etc., to prevent the locking bar 72 from moving back to its retracted (unlocking) position.

The locking bar 72 includes an end cap 90 which snaps onto a shank portion of the bar. The end cap also includes a flange 92 for facilitating manual actuation. The aperture 86 is formed in the shank portion and in the end cap 90. The end cap 90 includes a hole 93 which receives a projection 95 of the shank portion to enable the end cap to be snapped in place.

A spring is provided for biasing the locking bar 72 to its unlocking position to ensure that whenever the auxiliary locking member is removed from the aperture 86, the bar 72 will slide to a position allowing the access panel 14 to be closed. That spring is in the form of a rod or wire 96 secured at one end between a pair of protrusions or guide members 97 formed on the base 20, and at another end to a hole 100 disposed in the locking bar 72. The spring 96 extends between a pair of guide members 97 formed on the base 20. To assemble the access panel 14, the latch 40 is mounted on the posts 50, the locking bar 72 is inserted onto the guide elements 71, the spring 96 is connected between the base and locking bar, and the shielding plate 22 is mounted on the base 20 to secure the latch 40 and locking bar 72 to the base.

In operation, the access panel 14 is closed by positioning the lower edge 24 of the base against the lip 28 of the housing 12, and swinging the access panel toward the housing about that lower edge 24 as an axis. As this occurs, the tabs 32 of the shielding plate 22, and the fingers 37 of the base engage the vertical edges 34 of the opening 30 of the housing to horizontally shift the access panel into alignment with that opening. Eventually, the hooks 26 of the base 20 become caught behind the lip 28, and the hooks 60 of the latch 40 are flexed downwardly and then snap up to become caught behind the upper edge 38 of the opening 30 to hold the access panel closed.

In order to lock the access panel 14 against unauthorized entry, the locking bar 72 is pulled out to its locking position in which the notches 78 no longer underlie the projections 80 and in which the aperture 86 is exposed to receive the auxiliary lock, thereby preventing the locking bar 72 from returning to a release position.

When access to the interior of the housing is desired, the auxiliary lock is removed, whereupon the spring 96 pulls the locking bar 72 inwardly to its release position wherein the notches 78 underlie the projections 80. Then, the button 54 of the latch 40 is depressed, whereby the actuating portion 46 of the latch flexes downwardly relative to the mounting portion 44, causing the hooks 60 to become released from behind the upper edge 38 of the opening 30. The access panel 14 can now be swung open and removed from the housing, allowing the internal components to be accessed as shown in FIGS. 2–4.

Ready access to the housing interior is enhanced by mounting a cooling fan 110 on the access panel 14. That is, a cooling fan is useful in order to circulate cooling air within the interior of the housing to prevent overheating. Normally, the fan would be mounted on a flange of the housing 12 and would have to be removed in order to access components such as the accessory cards. In that event, access to the components would not be as rapid as desired. However, by mounting the fan 110 on the access panel 14, the fan is automatically moved to an unobstructive position upon opening the access panel 14. Furthermore, the fan is connected to a first electrical coupling in the form of a plug 112 by wires 113, and that plug 112 is mounted on the access panel 14 to become automatically plugged into a second electrical coupling in the form of a receptacle 114 mounted on the housing 12, when the access panel 14 is closed. The receptacle 114 is electrically connected to the power supply 16 disposed within the housing, to provide power to drive the fan 110. When the access panel is opened, the plug 112 and receptacle 114 automatically become uncoupled. During a closing of the access panel 12, alignment between the plug 112 and receptacle 114 is established by the tabs 32 of the shielding plate 22, and the fingers 37 of the base 20, so that the plug and receptacle can become automatically coupled.

It will be appreciated that by mounting the fan 110 on the access panel, full access to the housing interior can be established upon opening the access panel, because there is no need to separately remove the fan. Accordingly, access to the computer components can be rapidly achieved.

The access panel need not be made to be swingable relative to the housing. For instance, in lieu of providing the hooks 26 for mounting the access panel for swinging movement relative to the housing, instead an additional latch 40 and locking mechanism 70 could be employed for securing the lower portion of the panel to the housing.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A personal computer comprising:

a housing containing at least a power component, an accessory card supporting component, and a first electrical coupling electrically connected to the power component;

an access panel mounted to the housing, the panel being openable to provide access to the components;

a fan for circulating cooling air within the housing, the fan being mounted on the panel; and a second electrical coupling mounted on the panel and being electrically connected to the fan, the second coupling positioned to become electrically connected to the first coupling in response to the panel being closed, and to become electrically disconnected from the first coupling in response to the panel being opened;

wherein the panel and housing carry mutually engageable alignment elements for aligning the first and second couplings as the panel is being closed, the panel carrying a metal EMI shield, the shield including metal projections forming some of the alignment devices.

2. A tower personal computer comprising:

a housing containing at least a power component, an accessory card supporting component, and a first electrical coupling electrically connected to the power component, the housing including a vertical opening on one side thereof through which the components are removable;

a vertical access panel mounted to the housing for closing the opening, the panel being openable to open-up the housing and provide access to the components, the panel forming a vertical side of the tower personal computer for removal thereof, the panel being hinged to the housing for swinging movement between open and closed positions;

a fan for circulating cooling air within the housing, the fan being mounted on the panel; and a second electrical coupling mounted on the panel and being electrically connected to the fan, the second coupling positioned to become electrically connected to the first coupling in response to the panel being closed, and to become electrically disconnected from the first coupling in response to the panel being opened.

3. The personal computer according to claim 2, wherein the panel and housing carry mutually engageable alignment elements for aligning the first and second couplings as the panel is being closed.

4. The personal computer according to claim 3, wherein the panel carries a metal EMI shield, the shield including metal projections forming some of the alignment devices.

5. The personal computer according to claim 1, wherein the access panel is hinged for swinging movement between open and closed positions.

* * * * *